United States Patent [19]

Flasck

[11] Patent Number: 4,524,106
[45] Date of Patent: Jun. 18, 1985

[54] DECORATIVE CARBON COATING AND METHOD

[75] Inventor: James D. Flasck, Rochester, Mich.

[73] Assignee: Energy Conversion Devices, Inc., Troy, Mich.

[21] Appl. No.: 507,277

[22] Filed: Jun. 23, 1983

[51] Int. Cl.³ ............................................... B32B 9/00
[52] U.S. Cl. .............................. 428/408; 204/192 C; 204/192 SP; 204/298; 427/407.1; 427/407.2; 427/409; 427/410; 428/426; 428/457
[58] Field of Search ............... 427/122, 249, DIG. 11, 427/407.1, 407.2, 409, 410; 204/192 C, 192 SP, 192 R, 298; 428/408, 413, 426, 457, 500

[56] References Cited

U.S. PATENT DOCUMENTS

| | | | |
|---|---|---|---|
| 3,604,970 | 9/1971 | Culbertson et al. | 427/122 |
| 3,794,509 | 2/1974 | Trauger et al. | 427/DIG. 11 |
| 3,840,451 | 10/1974 | Golyanov et al. | 204/192 C |
| 3,867,191 | 2/1975 | Galasso et al. | 427/DIG. 11 |
| 4,173,522 | 11/1979 | Pulke et al. | 204/192 C |
| 4,309,483 | 1/1982 | Gravet | 427/122 |
| 4,412,903 | 11/1983 | Green | 204/192 C |
| 4,414,085 | 11/1983 | Wickersham et al. | 204/192 D |
| 4,437,962 | 3/1984 | Banks | 204/192 C |

FOREIGN PATENT DOCUMENTS 49-34596 9/1974 Japan .................. 204/192 C

OTHER PUBLICATIONS

Ojha et al., "The Growth Kinetics & Properties of Hard & Insulating Carbonaceous Films Grown in an R.F. Discharge", Thin Solid Films, vol. 60, pp. 213–225, 1979.
Nyaiesh et al., "Chemisorbed Hydrogen on a-Carbon Films", J. Vac. Sci., Technol. A, vol. 1, No. 2, pp. 308–312, Apr.–Jun. 1983.
Wada et al., "Diamond-Like, 3-Fold Coordinated Amorphous Carbon", The James Franck Institute & The Dept. of Physics, Univ. of Chicago.
Khan et al., "Interfacial Electrical Properties of Ion-Beam Sputter Deposited Amorphous Carbon on Silicon", IEEE Device Letters, No. 5, May 1983.

Primary Examiner—S. L. Childs
Attorney, Agent, or Firm—Lawrence G. Norris

[57] ABSTRACT

Coatings are provided that are especially useful for decorative purposes. The coatings are black, amorphous carbon and may be formed by dc magnetron sputtering on a substrate utilizing a target of high density graphite.

18 Claims, 3 Drawing Figures

DECORATIVE CARBON COATING AND METHOD

BACKGROUND

There are many cases in which it is desirable, often for esthetic reasons, to provide a decorative coating on the surface of an article. Decorative coatings are utilized on innumerable articles used under a variety of conditions. For example, decorative coatings are found on home and office furnishings, such as lamps, chairs, tables and appliances. Decorative coatings are utilized in connection with automobiles on non-functional items such as interior and exterior trim, and on functional items, such as door handles and door lock buttons. Other items included in these categories are, for example, window moldings, body moldings, wheel trim rings, radiator grills, bumpers, control knobs and levers and other similar parts, just to mention a few.

In the past, silver or similar colors were common for decorative coatings. Such coatings were often made by depositing over the article a layer of chrome, for example.

More recently, there has been a need to provide black decorative coatings for parts or articles, and in particular black coatings that are very bright and appear highly polished or lustrous. Black coatings have been provided in the past by applying black paint to the article surface, or by black anodizing, which requires an electrochemical reaction.

It would be desirable to provide a black coating of controlled thickness having good adherence and high gloss that is suitable for use as a decorative coating. In addition it would be desirable to provide a coating having a relatively high degree of inertness.

SUMMARY OF THE INVENTION

In accordance with the invention, thin, non-metallic carbon coatings are provided that are suitable for decorative coatings. The coatings can be formed by depositing carbon onto the surface of an article or substrate. As used herein, "substrate" and "article" are interchangeable and can include a coating or coatings other than the carbon coatings of the invention. Coatings in accordance with the invention are especially useful as decorative coatings and can be characterized as having a very high gloss. In addition, the coatings can be extremely black and highly opaque (non-transparent).

It is believed that the degree or shade of blackness and gloss of the coatings are related to several factors, which include coating surface morphology, microstructure and thickness and the smoothness of the substrate and the coating composition, as hereinafter described.

In accordance with another aspect of the invention, a decorative carbon coating is provided that is formed on a substrate by sputtering. Generally, the decorative coatings of the invention form either the exterior layer on a surface or are otherwise visible (e.g. a transparent coating can be applied over a decorative coating).

In accordance with a more specific aspect of the invention, disordered carbon coatings are provided. It has been discovered that disordered carbon coatings can be deposited on the surface of an article, which coatings are black and can have a high gloss with essentially featureless surface morphology. The coatings can also exhibit good adherence to the surface to which they are applied. The coatings are preferably amorphous or substantially amorphous. With respect to gloss, disordered coatings may exhibit a relatively high degree of specular reflection and a relatively low degree of diffuse reflection with greater disorder resulting in higher gloss. In addition, it is believed that as the disorder increases, integrity and physical stability of the coating is improved.

Any technique that forms a disordered carbon coating having adequate adherence can be utilized in accordance with the invention. Most desirably, the coatings are formed by depositing carbon directly from an elemental carbon source, such as by transferring atoms from an elemental carbon target to the substrate. In accordance with a more specific aspect of the invention, a carbon coating is formed by sputtering (non-reactive) using a carbon target. One especially suitable technique is dc magnetron sputtering. It has been discovered that dc magnetron sputtering carbon can provide a disordered, black carbon coating having a high gloss, good substrate adherence and essentially featureless surface morphology. In addition, sputtering allows the deposition to take place at relatively low temperatures, such as room temperature. The coatings can, therefore, be deposited on articles that cannot withstand relatively high temperature. Accordingly, suitable materials on which the coating can be deposited include metals and nonmetallic materials, including natural and synthetic polymers, for example. Thus, the coatings of the invention are particularly suited for thermoplastic materials, such as ABS (acrylonitrile-butadiene-styrene) resins, for example.

To a degree, the thickness of the coating determines the degree of blackness of the coating. The optical density of the coating is related to its thickness, until a certain thickness is achieved where a thicker coating will not provide a significant increase in optical density.

The smoothness of the substrate surface to which the coating is applied generally has an effect on the gloss of the coating. Usually, providing a smoother surface results in a coating having a higher gloss. Accordingly, where a high gloss coating is desired, the substrate surface should be relatively smooth.

The composition of the coating determines to a degree the color or shade of the coating. Preferably, the coatings essentially contain only carbon, although it is to be understood that minor amounts of impurities will almost invariably be present. Further, other elements or compounds other than carbon may be present, as long as they do not interfere with the desired color or gloss.

The coatings of the invention can be further characterized in being relatively inert and stable, with good resistance to color change as a result of exposure to ultraviolet radiation, for example.

In accordance with another aspect of the invention, a coated article is provided that includes a substrate portion and a decorative coating over at least a portion of the substrate. The coating is a thin black layer of disordered carbon.

DETAILED DESCRIPTION

Figure 1:
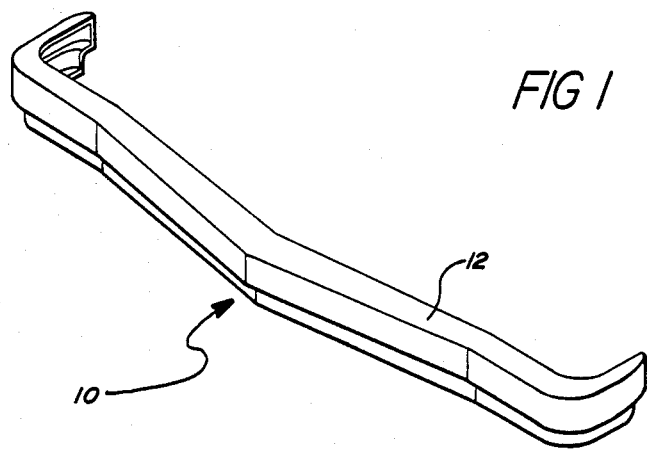
FIG. 1 illustrates in perspective view an article having a decorative coating in accordance with the invention applied thereon.

Most desirably, the carbon coatings of the invention are formed by sputtering. One especially useful type of sputtering is dc magnetron sputtering, although other methods of sputtering or depositing a thin layer of carbon on a surface may be suitable. Dc magnetron is generally preferred because the resulting carbon coatings exhibit good adherence and mechanical integrity.

Generally, prior to sputtering, the surface on which the carbon coating is to be applied should be suitably prepared. Where a high gloss coating is desired, the surface will preferably be relatively smooth, since this is believed to facilitate the formation of a high gloss coating. Some surfaces will already be smooth and no treatment is required. Where a smoother surface is desired, any suitable means can be utilized. For example, the surface may be polished. Alternatively, the surface may be precoated with a layer or layers of polymer material such as a thermoplastic or thermosetting polymer resin or other material which can provide a relatively smooth surface. Epoxy and acrylic resins are examples of such polymer materials. A combination of polishing and applying a precoat layer can also be utilized.

The surface preparation could also include, depending on the type of substrate, plasma or acid etching. Thereafter, the substrate may be sputter etched, if desired. In general, the surface should be suitable for sputtering and if surface preparation is necessary, any technique which is suitable to prepare the surface for sputtering can be utilized.

After the surface has been suitably prepared as desired, the carbon coating is applied by a suitable method. In accordance with one technique, the coatings are formed by dc magnetron sputtering utilizing a carbon target, and in particular, a high purity, high density graphite target. The sputtering atmosphere can be an inert gas, such as argon. The substrate temperature during sputtering can be very low, such as room temperature. A dc bias voltage may or may not be applied to the substrate. Utilizing a bias voltage provides improved adhesion of the carbon coating in some cases, although non-uniformity of the coating can begin to occur as the thickness of the coating increases. This is believed to be caused by the corresponding increase of the resistivity of the coating. Such effects are generally observed when the thickness of the coating is about 5000Å.

The thickness of the carbon coating can be varied and no minimum thickness is required. However, it is desirable for the thickness of the carbon coating to be in the range of from about 2000Å to about 5000Å (10,000Å=1 micrometer). Coatings which are thinner will be more transparent and the blackness of the coating will be less. Coatings thicker than 5000Å can be utilized, but for decorative uses, cost may be a limiting factor. The coatings are preferably thick enough to be substantially non-transparent.

The carbon coatings in accordance with the invention are believed to be relatively chemically inert and to generally possess good resistance to degradation from heat and ultraviolet radiation encountered from outdoor atmospheric conditions and other similar environments, for example.

Referring now to the drawings, several articles are depicted to which decorative coatings in accordance with the invention are applied. It is, of course, to be understood that the type of articles to which decorative coatings may be applied is virtually limitless, and these illustrations are merely set forth by way of example. In FIG. 1, there is illustrated a steel automobile bumper 10 having a decorative coating 12 in accordance with the invention on the surface thereof. Coating 12 is a thin black layer of substantially amorphous carbon and is from about 2000Å to about 5000Å in thickness and has a high gloss.

Figure 2:
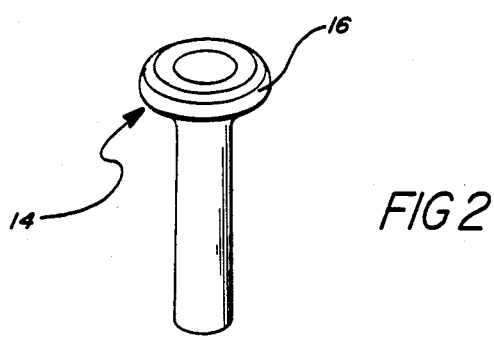
FIG. 2 illustrates in perspective view another article having a decorative coating in accordance with the invention applied thereon.

In FIG. 2, a plastic automobile door lock button 14 is illustrated having a decorative coating 16 in accordance with the invention on the surface thereof.

A protective overcoat layer may be provided over the carbon coating. For most applications the protective overcoat will be substantially transparent and clear, although it could be colored, if desired. Any such type of material which does not deleteriously affect the carbon layer to an unwanted degree can be used. For example, polymer resins can be used which are thermoplastic or thermosetting. Suitable polymer resins which can be selected from a wide group of materials. Included in this group are, for example, polyurethanes, vinyl polymers and copolymers, copolymers of vinylidene chloride and vinyl acetate, copolymers of vinylidene chloride and acrylonitride, copolymers of vinyl chloride and vinyl acetate, polycarbonates, polyamide, polyesters, ABS copolymers and the like. These materials are also suitable for use as a precoat over the substrate to provide a smoother surface. Any suitable method can be used to apply the overcoat or precoat layer. By way of illustration only, such methods include, for example, spraying, brushing, roller coating, dipping, spin coating, vacuum deposition, electrolysis, electrostatic spraying, or the like.

Figure 3:
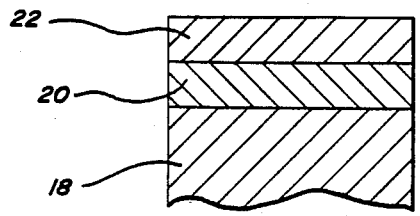
FIG. 3 illustrates in sectional view a coating in accordance with the invention having a transparent coating applied thereover.

Referring to FIG. 3, there is illustrated an enlarged cross-sectional view of a portion of a substrate 18 having a disordered carbon coating 20 in accordance with the invention. Applied over the surface of coating 20 is a thin layer of a protective overcoat 22, which serves to protect coating 20 from impact, scratching and abrasion. Protective overcoat 22 is a polymer resin that is substantially transparent.

As used herein, the term "disordered" includes amorphous, microcrystalline and polycrystalline (lacking long range order) phases or a mixture of any combination of those phases. By the term "amorphous" is meant a material which has long range disorder, although it may have short or intermediate order or even contain at times some crystalline inclusions.

EXAMPLE 1

A black, amorphous, substantially non-transparent carbon coating was formed on the surface of a glass substrate by dc magnetron sputtering. A target of high purity, high density graphite was utilized. The sputtering atmosphere was ultra high purity argon gas at a pressure of 6 microns ($6 \times 10^{-3}$ torr). The target power was about 80 watts per square inch of target surface and no bias voltage was applied to the substrate. The substrate was at about room temperature during sputtering. The resultant carbon coating was about 2000Å thick, had a high gloss and adhered well to the substrate. The composition of the coating was analyzed and it was found that the coating was essentially carbon, with less than 2 atomic percent nitrogen and oxygen being present.

EXAMPLE 2

Utilizing the procedure of Example 1, a black, amorphous carbon coating was formed on a steel substrate similar to the coating of Example 1.

EXAMPLE 3

Utilizing the procedure of Example 1, a black, amorphous carbon coating was formed on a polished nickel substrate similar to the coating of Example 1.

EXAMPLE 4

Utilizing the procedure of Example 1, a black, amorphous carbon coating was formed on a tungsten carbide substrate similar to the coating of Example 1.

EXAMPLE 5

A carbon coating was formed as described in Example 1 on an alloy-steel substrate, except that the substrate was biased at −500 volts with respect to ground.

EXAMPLE 6

The relative color of black, disordered carbon coatings made in accordance with the invention was measured with a colorimeter. The colorimeter measured the relative amount of incident light that was reflected from the coating surface. The coatings were made as described in Example 1 and were applied to various substrates in various thicknesses.

A Gardner XL20 Tristimulus Colorimeter was utilized in making the color measurements which were made in accordance with ASTM E 97-55 (1971) and D 2244-68. The measurements were made using white and black reference standards for calibration. Where a backing was utilized in making the measurements, the backing was on the side of the substrate opposite the side to which the coating was applied. The results are set forth in Table I.

TABLE I

| Sample | Coating Thickness (Angstroms) | Substrate | Relative Amount Of Incident Light Reflected | | |
|---|---|---|---|---|---|
| | | | Green | Red | Blue |
| — | — | (White Reference) | 82.5 | 84.6 | 98.3 |
| — | — | (Black Reference) | 0.2 | 0.0 | 0.1 |
| 1 | 400 | Glass | 1.2 | 0.9 | 1.0 |
| 1 | 400 | Glass with gray backing | 0.7 | 0.5 | 0.3 |
| 2 | 2,200 | Glass | 0.8 | 0.5 | 0.5 |
| 2 | 2,200 | Glass with white backing | 1.5 | 1.6 | 0.4 |
| 2 | 2,200 | Glass with gray backing | 0.4 | 0.3 | 0.2 |
| 2 | 2,200 | Glass with black backing | 0.3 | 0.1 | 0.2 |
| 3 | 2,800 | Glass | 0.5 | 0.2 | 0.3 |
| 3 | 2,800 | Glass with gray backing | 0.4 | 0.2 | 0.3 |
| 4 | 3,200 | Glass | 0.4 | 0.2 | 0.2 |
| 4 | 3,200 | Glass with gray backing | 0.4 | 0.2 | 0.2 |
| 5 | 5,000 | Glass | 0.5 | 0.2 | 0.3 |
| 5 | 5,000 | Glass with gray backing | 0.5 | 0.2 | 0.3 |
| 6 | 10,000 | Glass | 0.4 | 0.2 | 0.2 |
| 6 | 10,000 | Glass with white backing | 0.4 | 0.2 | 0.3 |
| 7 | 4,000 | Polished nickel | 1.2 | 0.9 | 1.4 |
| 8 | 4,000 | Matte finish Stainless Steel | 7.1 | 6.5 | 7.7 |
| 9 | 2,800 | Matte finish ABS gray plastic with epoxy precoat and overcoat | 0.4 | 0.2 | 0.3 |
| 10 | 5,000 | Clear polished plastic with epoxy precoat and overcoat | 0.4 | 0.2 | 0.3 |

The foregoing results illustrate the high degree of blackness obtained from relatively thin coatings in accordance with the invention.

EXAMPLE 7

The transmittance of Samples 1-6 from Example 6 was determined by measuring the samples with a MacBeth TD504 optical densitometer. The following results were obtained:

| Sample | Coating Thickness (Angstroms) | % Light Transmittance |
|---|---|---|
| — | Glass slide | 91.2 |
| 1 | 400 | 27.5 |
| 2 | 2,200 | 15.1 |
| 3 | 2,800 | 2.3 |
| 4 | 3,200 | 1.7 |
| 5 | 5,000 | 0.23 |
| 6 | 10,000 | 0.02 |

The foregoing results illustrate the high degree of opacity obtained from relatively thin coatings in accordance with the invention.

EXAMPLE 8

The gloss of samples 9 and 10 from Example 6 was measured with a Mallinckrodt Single Gloss glossmeter in accordance with ASTM Standard D 523, which provides a measurement of specular reflectance. The measurements were made relative to a black standard having a high gloss. The black standard exhibited reflection values of 92.0 and 87.0 for incident white light at angles of incidence of 60° and 20°, respectively.

Samples 9 and 10 exhibited reflectance values in excess of 150 for incident white light at both angles of incidence. Such reflectance values indicate that the coatings had a very high gloss similar to the gloss of a mirror.

While this invention has been described in relation to its preferred embodiments, it is to be understood that various modifications thereof will be apparent to those skilled in the art and it is intended to cover all such modifications which fall within the scope of the appended claims.

I claim:

1. A coating applied to a substrate comprising a thin black layer consisting of amorphous carbon formed by dc magnetron sputtering.

2. The coating of claim 1 wherein said layer has a high gloss.

3. The coating of claim 1 wherein said layer is from about 2000Å to about 5000Å thick.

4. The coating of claim 1 further comprising a layer of a substantially transparent protective material over said layer of amorphous carbon.

5. The coating of claim 1 wherein said layer of amorphous carbon is substantially non-transparent.

6. A method of forming a black, amorphous coating consisting of carbon comprising dc magnetron sputtering a layer of black, amorphous carbon on a substrate utilizing a target of high density graphite.

7. The method of claim 6 wherein said sputtered layer has a high gloss.

8. The method of claim 6 wherein said layer is from about 2000Å to 5000Å thick.

9. A coated article comprising:
a substrate; and a decorative coating formed by dc magnetron sputtering over at least a portion of the substrate said coating consisting essentially of a thin black layer of disordered carbon.

10. The article of claim 9 wherein said sputtering comprises dc magnetron sputtering with a negative bias voltage applied to the substrate.

11. The article of claim 9 wherein a carbon target is utilized in said sputtering.

12. The article of claim 9 wherein the article is an automobile part.

13. The article of claim 9 wherein said layer is from about 2000Å to about 5000Å thick.

14. The article of claim 9 further comprising a transparent protective coating over said black layer.

15. A method of making a black decorative coating having a high gloss comprising:
   providing a relatively smooth surface; and
   dc magnetron sputtering carbon from a high density graphite target on the smooth surface to form a thin, black layer consisting of amorphous carbon on the surface.

16. The method of claim 15 further comprising applying a bias voltage to the substrate during sputtering.

17. The method of claim 15 wherein said layer is from about 2000Å to about 5000Å thick.

18. The method of claim 15 wherein said relatively smooth surface is provided by precoating a substrate with polymer material.

* * * * *